United States Patent [19]

Sasano

[11] Patent Number: 4,554,415
[45] Date of Patent: Nov. 19, 1985

[54] BILATERAL AMPLIFIER

[75] Inventor: Nakamichi Sasano, Tokyo, Japan

[73] Assignee: Comnix Kabushiki Kaisha, Tokyo, Japan

[21] Appl. No.: 463,725

[22] Filed: Feb. 4, 1983

[30] Foreign Application Priority Data

Oct. 22, 1982 [JP] Japan ................................ 57-185818

[51] Int. Cl.4 .............................................. H04B 3/36
[52] U.S. Cl. ................................. 179/170 G; 333/216
[58] Field of Search ................. 179/170 G, 175.31 E, 179/170.2; 333/216, 217

[56] References Cited

U.S. PATENT DOCUMENTS 4,028,505  6/1977  Fassino ........................ 179/170 G Primary Examiner—James L. Dwyer
Attorney, Agent, or Firm—Browdy and Neimark

[57] ABSTRACT

A bilateral amplifier is disclosed, which comprises a negative impedance converter which is connected between two signal sources similar in character when viewed as loads. One of the signal sources is utilized as a load for negative impedance conversion with respect to the other signal, while the other signal source is utilized as a load for negative impedance conversion with respect to the first-mentioned signal source.

2 Claims, 6 Drawing Figures

BILATERAL AMPLIFIER

BACKGROUND OF THE INVENTION

1. Field of the Invention

This invention relates to a bilateral amplifier.

2. Description of the Prior Art

Various kinds of bilateral amplifier which can amplify not only in one direction but also in the other direction are known and in practical use. One such type of bilateral amplifier uses a hybrid transformer or the like and operates on the basis of a 2-way/4-way separating section. In another type of bilateral amplifier, negative impedance is used.

FIG. 1 shows the principles of the former type of bilateral amplifier. A signal produced from a signal source 10 (which may be a transmitting section of a telephone set) is input through a load 11 to one pair of input terminals 1c and 1d of a 2-way/4-way separating section 12 and output from a pair of output terminals 1e and 1f of the section 12 to be amplified in an amplifier 13. The output of the amplifier 13 is input to a pair of input terminals 2a and 2b of another 2-way/4-way separating section 22 and output from a pair of input terminals 2c and 2d to be consumed in a load 21 (which may be a receiving section of a remote telephone set). Meanwhile, a signal produced from a remote side signal source 20 is input through the load 21 to the pair of input/output terminals 2c and 2d of the other 2-way/4-way separating section 22 and output from a pair of output terminals 2e and 2f of the section 22 to be amplified in another amplifier 23. The output of the amplifier 23 is input to another pair of input terminals 1a and 1b of the 2-way/4-way separating section 12 and output from the pair of input terminals 1c and 1d to be consumed in the load 11.

In this system, in order to ensure sufficient degree of separation of the two 2-way/4-way separating sections 12 and 22, impedance circuits 14 and 24, the impedance of which is equal to the impedance of the loads 11 and 21 connected to the respective pairs of input/output terminals 1c and 1d and 2c and 2d, must be connected to respective further pairs of terminals 1g and 1h and 2g and 2h of the separating sections 12 and 22. Where the impedance of the impedance circuits 14 and 24 and the impedance of the loads 11 and 21 are not equal, the separation performance of the 2-way/4-way separating sections 12 and 22 is deteriorated. More specifically, the signal input to the terminals 1a and 1b does not output 100% from the terminals 1c and 1d but partly leaks to the terminals 1e and 1f. Likewise, a signal input to the separating section 22 partly leaks to the terminals 2e and 2f. In such a case, feedback loops are established with respect to the amplifiers 13 and 23, thus reducing the degree of amplification and also leading to such undesired phenomena as oscillation. To avoid these undesired effects, the degree of amplification must be reduced. Where the loads 11 and 21 are pure resistances, the impedance circuits 14 and 24 may be simple, and the degree of reduction of the amplification as noted can be avoided. Where the loads 11 and 21 are distributed constant circuits represented by an equivalent circuit as shown in FIG. 2, consisting of infinite numbers of progressively connected L, C, R and G, however, it is difficult to construct an identical distributed constant circuit. In this case, therefore, an equivalent circuit is realized with a lumped constant circuit. To this end, however, an active complicated circuit construction is required. If it is difficult to realize such a circuit, the afore-mentioned reduction of degree of amplification results. Further, where the loads 11 and 21 are indefinite, it is impossible to design the equivalent impedance circuits 14 and 24. Further, the bilateral amplifier utilizing a hybrid transformer requires two separating sections, which is undesired from the standpoint of economy.

FIG. 3 shows the principles of the latter type of bilateral amplifier, i.e., the one which makes use of negative impedance.

The amplifier includes negative impedance converters 32 and 42 (hereinafter referred to as NIC). The NIC 32 forms together with an impedance circuit 33 a current type negative impedance. The NIC 32 is connected in series with loads 31 and 41. The NIC 42 forms together with an impedance circuit 43 a voltage type negative impedance. The NIC 42 is connected in parallel with the loads 31 and 41, and it is connected to a mid point of a coil 35 connected in parallel with the NIC 32.

Designated at 30 and 40 are signal sources, and at 31 and 41 are loads which consume signals transmitted from the respective signal sources 30 and 40.

It is well known that impedance matching is obtained when relations $$Zs = N \cdot ZL$$
and
$$Zp = \frac{1}{N} \cdot ZL$$

are met, where ZL is the impedance of the loads 31 and 41, Zs and Zp are the impedances of the respective impedance circuits 33 and 43, and N is any positive real number, and also the degree of voltage amplification $\gamma$ is expressed as $$\gamma = \frac{1 + \sqrt{\frac{Zs/2}{2Zp}}}{1 - \sqrt{\frac{Zs/2}{2Zp}}} = \frac{1 + \sqrt{N \cdot 2/4}}{1 - \sqrt{N \cdot 2/4}} = \frac{1 + N/2}{1 - N/2} = \frac{2 + N}{2 - N}$$

The latter equation means that $\gamma$ becomes infinity as N approaches 2. In order to increase the degree of amplification, therefore, it is necessary to let Zp approximate ZL/2 and let Zs approximate 2ZL. If these approximations for the impedance circuits 33 and 43 are unsatisfactory, the degree of amplification may be unsatisfactory, or the oscillation phenomenon is liable to result. That is, with this type of bilateral amplifier, like the previously described type, if the equivalent circuits of the loads are hard to realize or complicated, it is necessary to increase the amplification degree due to low amplification or to avoid the oscillation phenomenon. Further, this type of bilateral amplifier requires two NICs and two impedance circuits, which is disadvantageous in view of economy.

SUMMARY OF THE INVENTION

An object of the present invention is to provide an economical bilateral amplifier, with which two signal sources which are similar in character when viewed as loads are connected to each other through a negative impedance converter while utilizing one of the signal sources as a load for negative impedance conversion with respect to the other signal source and utilizing the other signal source for negative impedance conversion with respect to the first-mentioned signal source, so that stable operation can be obtained without need of reducing the degree of amplification even if the two loads are indefinite or even if it is difficult to realize equivalent circuits of the loads.

DETAILED DESCRIPTION OF PREFERRED EMBODIMENTS

The present invention will now be described with reference to FIG. 4.

Figure 1:
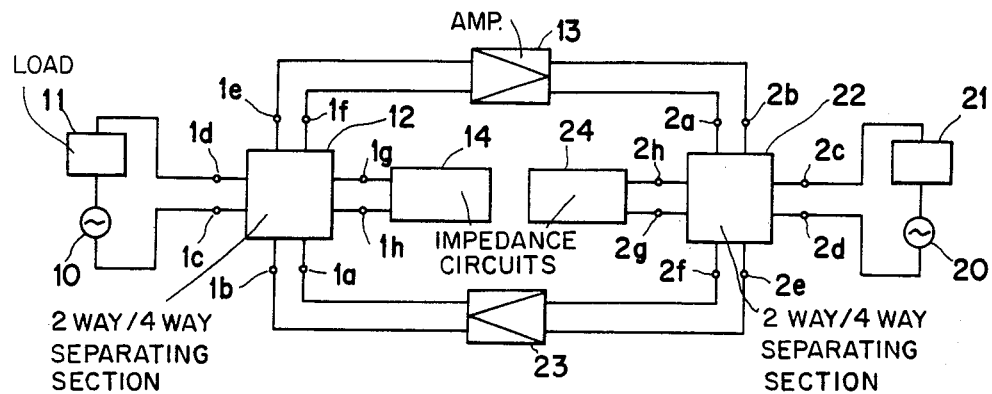
FIG. 1 is a block diagram showing a prior art bilateral amplifier.
Figure 2:
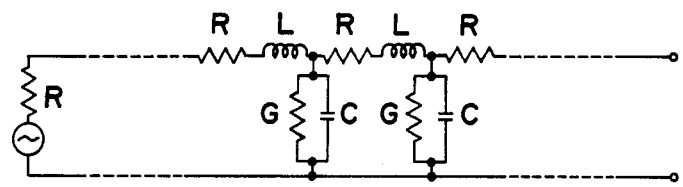
FIG. 2 is a circuit diagram showing a distributed constant circuit.
Figure 3:
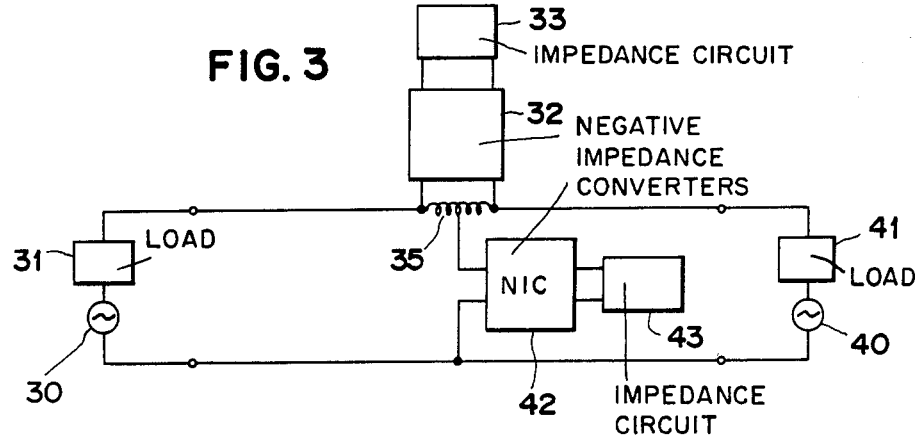
FIG. 3 is a block diagram showing a different example of the prior art bilateral amplifier.

Like the case of FIG. 3, the circuitry includes signal sources 30 and 40, impedance loads 38 and 48 of the respective signal sources 30 and 40, and line impedances 49 and 39 for the respective signal sources 30 and 40 with respect to an NIC 45. The NIC 45 is a four-terminal network having terminals a, b, c and d, and it is a negative impedance converter, the impedance of which looked from one terminal side is minus one time the impedance connected to the other terminal side.

The character of the NIC can be described by the fact that in this circuit there hold relations $$\dot{E}_1 = \dot{E}_2$$

and $$\dot{I}_1 = \dot{I}_2$$

where $E_1$ and $E_2$ are respectively voltages between the terminals a and b and between the terminals c and d, and $I_1$ and $I_2$ are respectively a current flowing from the terminal a into the NIC 45 and a current flowing out from the terminal c of the NIC 45. This character is well known in the art.

Figure 4:
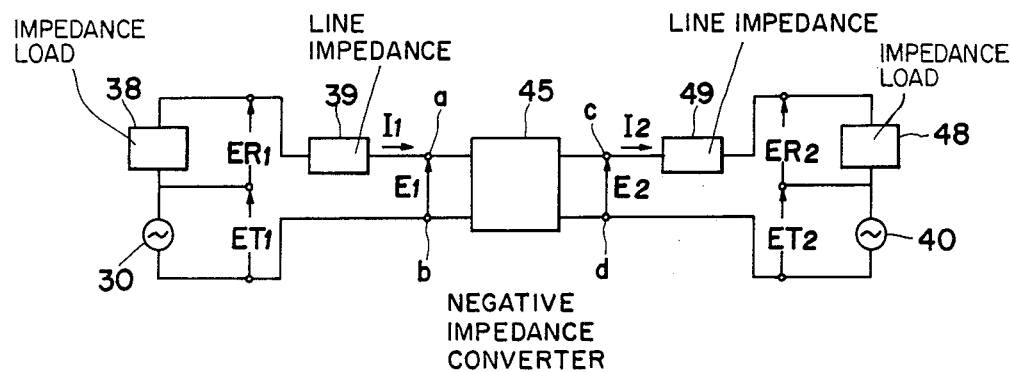
FIG. 4 is a block diagram for explaining the operation of the bilateral amplifier according to the present invention.
Figure 5A:
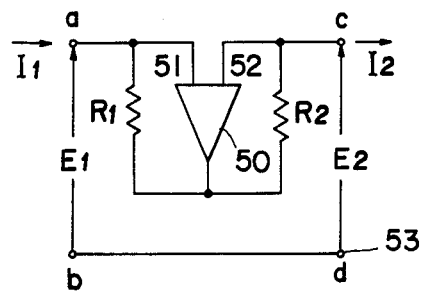
FIGS. 5a and 5b are circuit diagrams showing the principles of examples for application of negative impedance converters.

FIG. 5a shows a specific construction of the NIC 45 shown in FIG. 4. This NIC is realized using an operational amplifier. The fact that the relations noted above hold with this construction will now be described in detail. Referring to FIG. 5a, designated at 50 is an operational amplifier having differential input terminals 51 and 52. In FIG. 5a, the same symbols designate the same terminals, voltages and currents as in FIG. 4. Designated at $R_1$ and $R_2$ are resistors which are connected between the respective differential input terminals 51 and 52 of the operational amplifier 50 on one hand and the output terminal 53 thereof on the other hand.

If the gain A of the operational amplifier is sufficiently large, there holds a relation $$\dot{E}_0 = -A(\dot{E}_2 - \dot{E}_1)$$

where $E_0$ is the voltage at the output terminal of the operational amplifier. However, if the input impedance of the operational amplifier is sufficiently high while the output impedance thereof is low, $E_1$ settles to a value equal to $E_2$.

Thus, $$\dot{I}_1 = (\dot{E}_1 - \dot{E}_0)/R_1$$

and $$\dot{I}_2 = (\dot{E}_0 - \dot{E}_2)/R_2$$

so that we have a relation $$\dot{I}_1 = -\frac{R_2}{R_1} \cdot \dot{I}_2$$

In other words, if $\dot{E}_1 = \dot{E}_2$ and $$\dot{I}_1 = -\frac{R_2}{R_1} \cdot \dot{I}_2$$

while $R_1 = R_2$, we have $$\dot{I}_1 = -\dot{I}_2$$

Figure 5B:
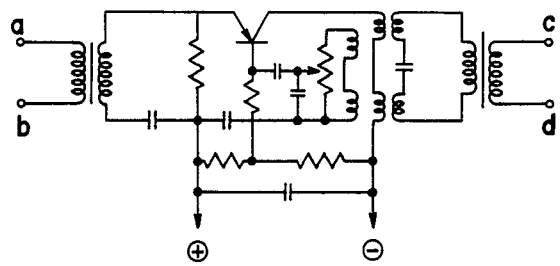

There have been known a number of circuits realizing the NIC, among which is a circuit shown in FIG. 5b. This circuit is extensively used by Nippon Telegraph & Telephone Public Corporation and is disclosed in "Wire Transmission Engineering", compiled by the Association of Electronic Communication Engineers.

In FIG. 4, the voltages generated from the signal sources 30 and 40 are respectively indicated by $ET_1$ and $ET_2$, the signal source impedances 38 and 48 are respectively indicated by $ZR_1$ and $ZR_2$, and the terminal voltages across the impedances 39 and 49 are respectively indicated by $ZL_1$ and $ZL_2$. The signal $ET_1$ on the side of the terminals a and b of the NIC 45 (hereinafter referred to as left side) is measured between the opposite terminals of the signal source impedance 48 on the side of the terminals c and d of the NIC 45 (hereinafter referred to as right side). Also, the signal $ET_2$ on the right side is measured between the opposite terminals of the signal source impedance 38 on the left side.

As discussed in detail before, in the NIC 45 there always hold relations $$\dot{E}_2 = \dot{E}_1$$

and $$\dot{I}_2 = -\dot{I}_1.$$

Meanwhile, there holds a relation $$\dot{E}T_1 = \dot{E}_1 + \dot{I}_1(\dot{Z}R_1 + \dot{Z}R_1) \quad (1)$$

on the left side of the NIC 45, while there holds a relation $$\dot{E}_2 = \dot{E}T_2 + \dot{I}_2(\dot{Z}L_2 + \dot{Z}R_2) \quad (2)$$

on the right side of the NIC 45.

Since $\dot{E}_2 = \dot{E}_1$ and $\dot{I}_2 = -\dot{I}_1$, from the equation (2) we can obtain $$E_1 = \dot{E}T_2 + (-\dot{I}_1)(\dot{Z}L_2 + \dot{Z}R_2)$$

substituting $E_1$ in the equation (1) as $E_1$ in the above equation, the equation (1) can be transformed as $$ET_1 = ET_2 + (-I_1)(ZL_2 + ZR_2) + I_1(ZR_1 + ZL_1)$$

$$\dot{E}T_1 = \dot{E}T_2 + \dot{I}_1\{(\dot{Z}R_1 + \dot{Z}L_1) - (\dot{Z}L_2 + \dot{Z}R_2)\}$$

and $$\dot{E}T_1 - \dot{E}T_2 = \dot{I}_1\{(\dot{Z}R_1 + \dot{Z}L_1) - (\dot{Z}L_2 + \dot{Z}R_2)\}$$

By setting $$\dot{Z}R_1 + \dot{Z}L_1 = \dot{Z}_1$$

and $$\dot{Z}R_2 + \dot{Z}L_2 = \dot{Z}_2$$

we have $$\dot{E}T_1 - \dot{E}T_2 = \dot{I}_1(\dot{Z}_1 - \dot{Z}_2)$$

Hence, $$\dot{I}_1 = \frac{\dot{E}T_1 - \dot{E}T_2}{\dot{Z}_1 - \dot{Z}_2}$$

Further, by setting $$\dot{E}T_1 - \dot{E}T_2 = \Delta \dot{E}T$$

and $$\dot{Z}_1 - \dot{Z}_2 = \Delta \dot{Z}$$

we have $$\dot{I}_1 = \frac{\Delta \dot{E}T}{\Delta \dot{Z}} \quad (3)$$

$$\dot{I}_2 = -\dot{I}_1$$

and $$\dot{I}_2 = \frac{-\Delta \dot{E}T}{\Delta \dot{Z}} \quad (4)$$

For the terminal voltage $ER_1$ across the signal source impedance 38, $$-\dot{E}R_1 = \dot{I}_1 \cdot ZR_1$$

Substituting the equation (3) for $I_1$, $$-\dot{E}R_1 = \frac{\Delta \dot{E}T}{\Delta \dot{Z}} \cdot \dot{Z}R_1$$

Hence, $$\dot{E}R_1 = \frac{-\Delta \dot{E}T}{\Delta \dot{Z}} \cdot \dot{Z}R_1 \quad (5)$$

For the terminal voltage $ER_2$ across the signal source impedance 48, $$\dot{E}R_2 = \dot{I}_2 \cdot ZR_2$$

Substituting the equation (4) for $I_2$, $$ER_2 = \frac{-\Delta \dot{E}T}{\Delta \dot{Z}} \cdot \dot{Z}R_2 \quad (6)$$

These equations mean power amplification from the left side to the right side. More particularly, power $ET_1 \cdot I_1$ provided by $ET_1$ when $ET_1 \neq 0$ and $ET_2 = 0$, and power $ER_2 \cdot I_2$ measured at this time with $ZR_2$ are compared. The power amplification degree $\alpha$ from the left side to the right side is expressed as $$\dot{\alpha} = \frac{\dot{E}R_2 \cdot \dot{I}_2}{\dot{E}T_1 \cdot \dot{I}_1}$$

Since $$\dot{I}_2 = -\dot{I}_1 \neq 0,$$

$$\dot{\alpha} = \frac{-\dot{E}R_2}{\dot{E}T_1}$$

Substituting the equation (6) for $\dot{E}R_2$, $$\dot{\alpha} = \frac{\frac{\Delta \dot{E}T}{\Delta \dot{Z}} \cdot \dot{Z}R_2}{\dot{E}T_1} = \frac{\Delta \dot{E}T \cdot \dot{Z}R_2}{\Delta \dot{Z} \cdot \dot{E}T_1}$$

Since $$\Delta \dot{E}T = \dot{E}T_1 - \dot{E}T_2$$

and also since $\Delta \dot{E}T = \dot{E}T_1$ for $\dot{E}T_2 = 0$, we have $$\dot{\alpha} = \frac{\Delta \dot{E}T \cdot \dot{E}R_2}{\Delta \dot{Z} \cdot \dot{E}T_1} = \frac{\dot{E}T_1 \cdot \dot{Z}R_2}{\Delta \dot{Z} \cdot \dot{E}T_1} = \frac{\dot{Z}R_2}{\Delta \dot{Z}}$$

Hence, $$\dot{\alpha} = \frac{\dot{Z}R_2}{\Delta \dot{Z}} \quad (7)$$

Now, power amplification from the right side to the left side will be described.

Power $\dot{E}T_2 \cdot \dot{I}_1$ provided by $\dot{E}T_2$ when $\dot{E}T_2 \neq 0$ and $\dot{E}T_1 = 0$ and power $\dot{E}R_1 \cdot \dot{I}_1$ measured at this time with $\dot{Z}R_1$ are compared. The power amplification degree $\beta$ from the right to the left is expressed as $$\beta = \frac{\dot{E}R_1 \cdot \dot{I}_1}{\dot{E}T_2 \cdot \dot{I}_2}$$

Since $\dot{I}_2 = -\dot{I}_1 \neq 0$ $$\beta = \frac{-\dot{E}R_1}{\dot{E}T_2}$$

Substituting the equation (5) for $\dot{E}R_1$, $$\beta = \frac{\frac{-\Delta \dot{E}T}{\Delta \dot{Z}} \cdot \dot{Z}R_1}{\dot{E}T_2} = \frac{-\Delta \dot{E}T \cdot \dot{Z}R_1}{\Delta \dot{Z} \cdot \dot{E}T_2}$$

Since $$\Delta \dot{E}T = \dot{E}T_1 - \dot{E}T_2$$

and also since $\Delta \dot{E}T = -\dot{E}T_2$ for $\dot{E}T_1 = 0$, we have $$\beta = \frac{-\Delta \dot{E}T \cdot \dot{Z}R_1}{\Delta \dot{Z} \cdot \dot{E}T_2} = \frac{\dot{E}T_2 \cdot \dot{Z}R_1}{\Delta \dot{Z} \cdot \dot{E}T_2} = \frac{\dot{Z}R_1}{\Delta \dot{Z}}$$

Hence, $$\beta = \frac{\dot{Z}R_1}{\Delta \dot{Z}} \quad (8)$$

It will be seen from the equations (7) and (8) that the amplification degrees $\alpha$ and $\beta$ have $\Delta Z$ as the denominator. This means that the amplification degree is increased with reducing $\Delta Z$.

With the presence of $\Delta \dot{Z}$ as the denominator in the equations (7) and (8), indicating increasing degree of amplification with reducing $\Delta Z$, the degree of amplification is infinity when $Z_1 = Z_2$, i.e., $\Delta Z = 0$. Thus, even if $Z_1$ and $Z_2$ are not simple or indefinite, a large degree of amplification can be obtained so long as $Z_1$ and $Z_2$ are similar to each other.

As has been described in the foregoing, according to the invention the bilateral amplifier can be realized as a simple circuit using a single NIC. Also, since no equivalent circuit is needed, the number of component parts can be reduced, which is desired from the standpoint of economy. Further, the necessary negative impedance can be readily realized even in the case where the impedance of the load is unclear or indefinite or complicated and difficult to realize, so that it is possible to ensure stable operation without reducing the degree of amplification. Further, if the NIC is constructed without using L, C or T, it is possible to obtain superior frequency characteristics and cover a frequency range from DC to a high frequency.

The bilateral amplifier according to the invention is suitable as a relay amplifier for an interphone, wire broadcasting and a telephone circuit.

What is claimed is:

1. A system for bilateral amplification comprising
   a single negative impedance converter having first and second terminal sides;
   a first signal source having an impedance load;
   a first connecting means having line impedance, to connect said first signal source to said first terminal side;
   a second signal source having an impedance load;
   a second connecting means having line impedance, to connect said second signal source to said second terminal side;
   said first signal source with its impedance load being utilized as a load for negative impedance conversion with respect to said second signal source;
   said second signal source with its impedance load being utilized as a load for negative conversion with respect to said first signal source;
   said first and second signal sources and their respective impedance loads being of similar forms of impedances and loads.

2. The system for bilateral amplification of claim 1, further characterized by
   the values of said impedance load of said first signal source and said line impedance of said first connecting means substantially equal to the values of said impedance load of said second signal source and said line impedance of said second connecting means.

* * * * *